US012660142B2

(12) United States Patent
Xie et al.

(10) Patent No.: US 12,660,142 B2
(45) Date of Patent: Jun. 16, 2026

(54) SHIELDED CABLE

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Han-Run Xie, Huaian (CN); Lu-Yu Chang, New Taipei (TW); A-Nan Yang, Huaian (CN)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 21 days.

(21) Appl. No.: 18/748,501

(22) Filed: Jun. 20, 2024

(65) Prior Publication Data

US 2024/0431084 A1     Dec. 26, 2024

(30) Foreign Application Priority Data

Jun. 21, 2023    (CN) .......................... 202310741661.9

(51) Int. Cl.
*H05K 9/00* (2006.01)
*H01B 11/00* (2006.01)

(52) U.S. Cl.
CPC .......... *H05K 9/0098* (2013.01); *H01B 11/002* (2013.01)

(58) Field of Classification Search
CPC .................................................... H05K 9/0098
See application file for complete search history.

(56) References Cited

U.S. PATENT DOCUMENTS

| | | | |
|---|---|---|---|
| 11,069,458 B2 | 7/2021 | Te | |
| 12,156,392 B1 * | 11/2024 | Liu | ...................... H05K 9/0088 |
| 2018/0096755 A1 | 4/2018 | Tsujino et al. | |
| 2020/0118714 A1 * | 4/2020 | Hornung | .............. H05K 9/0088 |

* cited by examiner

*Primary Examiner* — Hung V Ngo
(74) *Attorney, Agent, or Firm* — Ming Chieh Chang

(57) ABSTRACT

A cable includes: a pair of core wires; a shielding tape covering the pair of core wires; and an outer insulation layer covering the shielding tape, wherein the shielding tape is longitudinally wrapped around the pair of core wires, the shielding tape includes a shielding layer and a glue layer located on the outer surface of the shielding layer, and the glue layer is only provided on an overlapped portion of the shielding tape.

5 Claims, 4 Drawing Sheets

SHIELDED CABLE

BACKGROUND OF THE INVENTION

Field of the Invention

The present invention relates generally to a cable, and more particularly to a cable used to transmit high frequency signals.

Description of Related Arts

With the development and popularization of electronic technology products, cables are widely used in household appliances, instrumentation, automation equipment, data centers, servers, switches, cloud computing and 5G as a tool for signal transmission. However, in the signal transmission process, the cable is susceptible to interference from external electromagnetic signals, so it is often necessary to use a shielding structure to eliminate or reduce the interference of the external electromagnetic field, and to prevent the leakage of the transmission signal. In traditional designs, a layer of adhesive is placed on the surface of the shielding layer to fix the shielding layer to the cable. However, the presence of glue increases the loss factor of the cable and increases the attenuation, thus affecting the electrical performance of the cable.

FIG. 1 shows a conventional shielding tape used in traditional high-speed cables. The shielding tape includes a metal layer 201, an insulating layer 202, and an intermediate adhesive layer 203 that connects the metal layer 201 and the insulating layer 202 together. Hot melt glue 204 is provided on the entire surface of the insulating layer 202. When the shielding tape is wrapped on the cable, the loss factor of the hot melt glue 204 is high, resulting in a large overall attenuation of the cable.

Therefore, it is necessary to provide an improved cable with better electrical properties.

SUMMARY OF THE INVENTION

A main object of the present invention is to provide a cable suitable for transmitting high-speed signals, and has a stable structure.

To achieve the above object, a cable comprises: a pair of core wires; a shielding tape covering the pair of core wires; and an outer insulation layer covering the shielding tape, wherein the shielding tape is longitudinally wrapped around the pair of core wires, the shielding tape includes a shielding layer and a glue layer located on the outer surface of the shielding layer, and the glue layer is only provided on an overlapped portion of the shielding tape.

Compared to prior art, the glue layer of the shielding tape of the present invention is only provided at the overlapping portion when the shielding tape covers the core wire, there is no glue on the surface of other parts of the shielding tape, so that the electrical performance of the cable is better, and the shielding tape has a stable structure on the cable.

DETAILED DESCRIPTION OF THE PREFERRED EMBODIMENT

Figure 2:
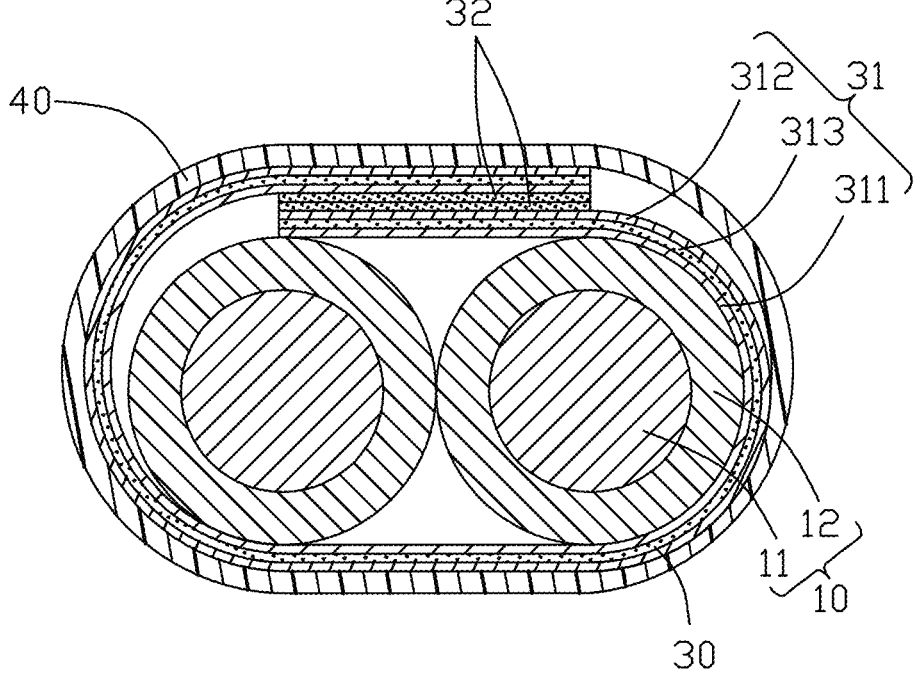
FIG. 2 is a cross-sectional view of a cable according to the present invention.

Referring to FIG. 2, a cable 100 in accordance with the present invention is shown. The cable 100 includes a pair of core wires 10, a shielding tape 30 covering the core wires 10, and an outer insulation layer 40 covering the shielding tape 30.

The pair of core wires 10 are arranged in contact with each other. Each core wire 10 includes an inner conductor 11 and an inner insulation layer 12 covering the inner conductor 11. The inner conductor 11 is used to transmit high-speed signals. The inner insulation layer 12 of each core wire 10 is extruded and molded to cover the inner conductor 11. The shielding tape 30 covers the pair of core wires 10 in a longitudinal wrapping way. The shielding tape 30 includes a shielding layer 31 and a glue layer 32 located on the surface of the shielding layer 31. The shielding layer 31 includes a metal layer 311, an insulating layer 312, and an intermediate adhesive layer 313 that combines the metal layer 311 and the insulating layer 312. The metal layer 311 may be made of conductive metal such as metal aluminum, metal copper or metal silver. The material of the insulating layer 312 can be one of PET (polyethylene terephthalate), PP (polypropylene) or FTFE (Polytetrafluoroethylene). The intermediate adhesive layer 313 is composite glue. In other embodiments, the shielding layer 31 can also have only the metal layer 311 and the insulating layer 312 without providing the intermediate glue layer 313, and the metal layer 311 is directly rolled on the insulating layer 312.

Figure 3:
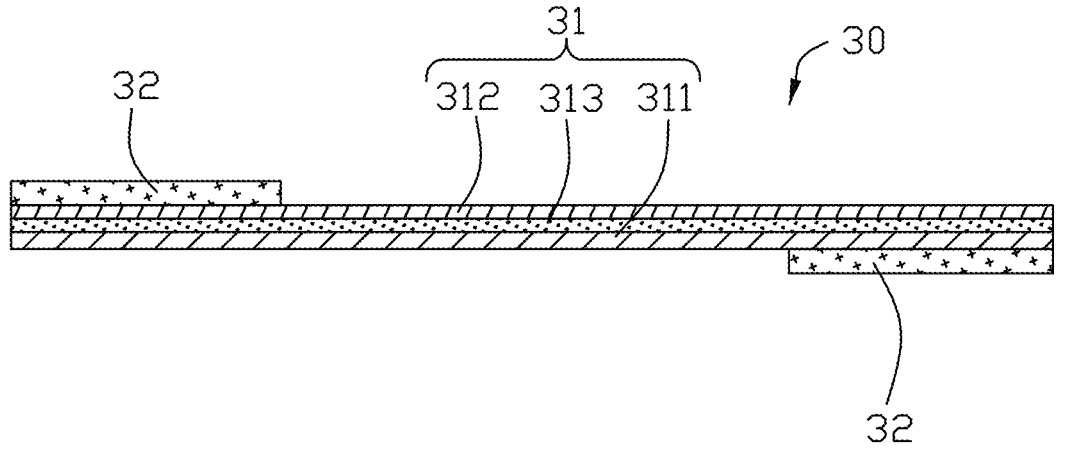
FIG. 3 is a side view of the shielding tape of the present invention.
Figure 4:
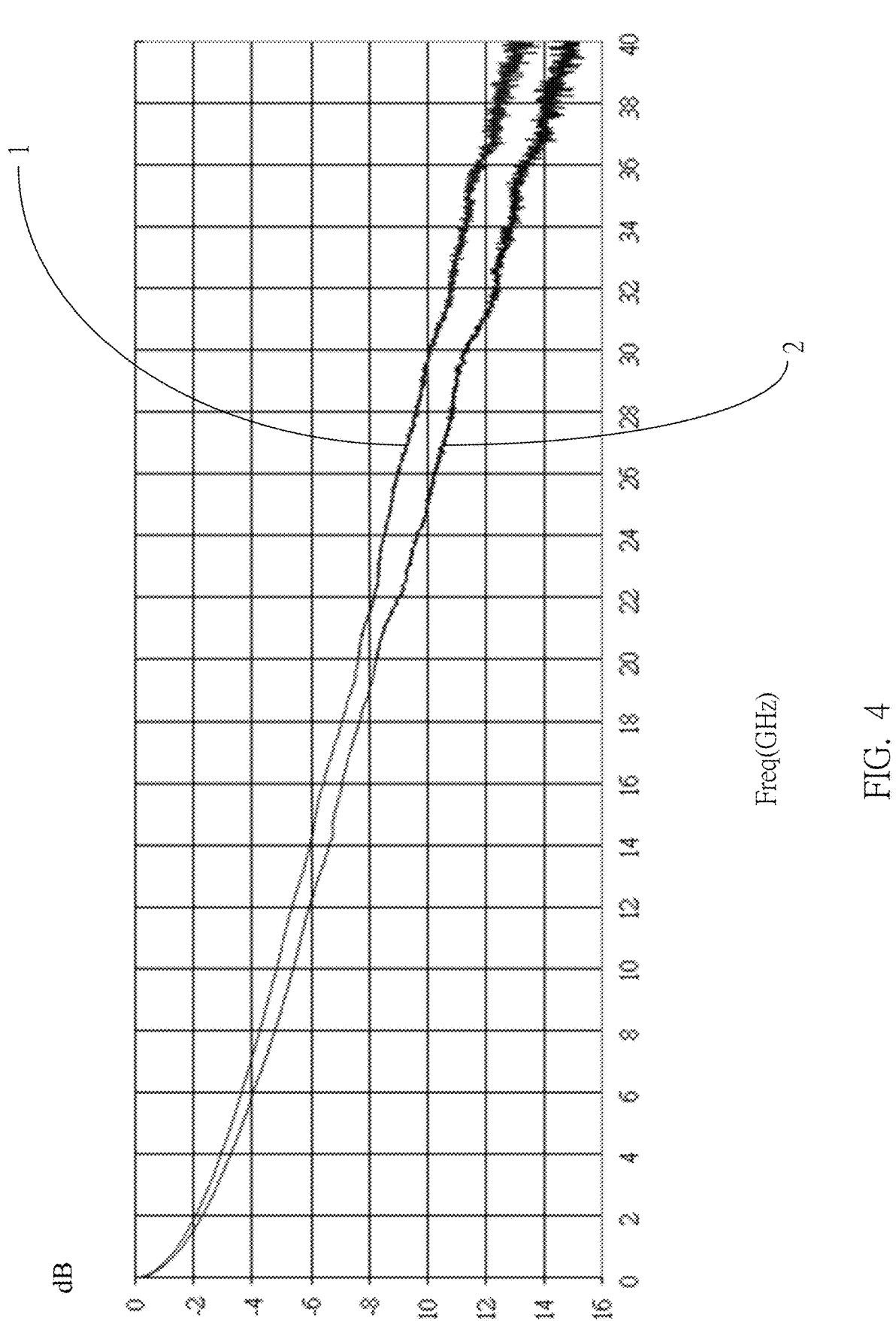
FIG. 4 is a performance curve of cables using the shielding tape of the present invention and using the traditional shielding tape.

Referring to FIG. 3, the glue layer 32 is only provided on the overlapping portion when the shielding tape 30 covers the core wire 10. The two ends of the shielding tape 30 are bonded through the glue layer 32 to stably fix the shielding tape 30 and form a stable connection. The glue layer 32 may be provided on only one surface of the shielding layer 31, or the glue layer 32 may be provided on both surfaces of the shielding layer 31. Specifically, in the present invention, both surfaces of the shielding tape 30 are provided with glue layers 32. When the shielding tape 30 is wrapped around the pair of the core wires 10, the glue layers 32 on the two surfaces overlap each other. The thickness of the glue layer 32 is between 0.001 mm and 0.006 mm. Specifically, in the present invention, the thickness of the glue layer 32 is 0.003 mm. The area of the shielding layer 31 covered with glue accounts for 25% to 30% of the entire surface area of the shielding layer 31.

Figure 1:
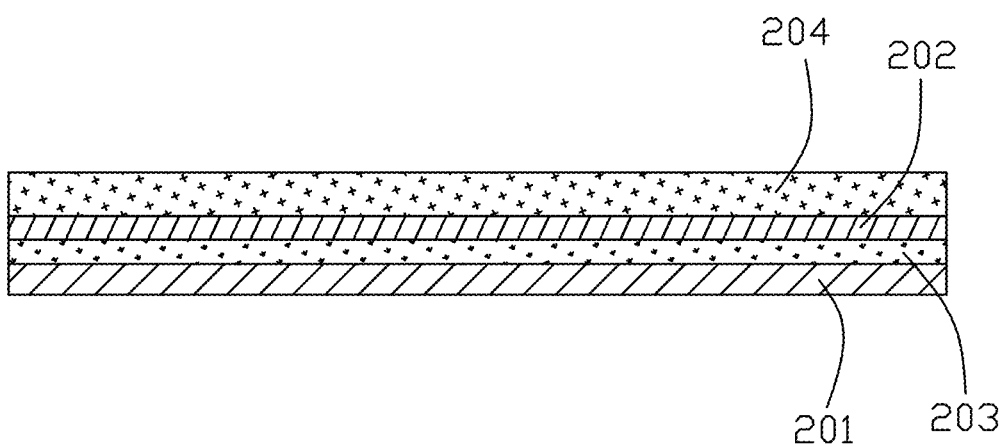
FIG. 1 is a conventional shielding tape used in traditional high-speed signal cables.

Referring to FIG. 3, which is the SDD21 (Differential Insertion Loss) curve of the cable 100 using the shielding tape 30 of the present invention, and the SDD21 curve of the cable using the traditional shielding tape. The test samples have the same structure except for the shielding tape. The cable 100 uses the structure of FIG. 2 and American Wire Gauge 30 (30 AWG) as the sample. The abscissa is the frequency, the unit is GHz, and the ordinate is the loss, unit is dB. Curve 1 is the SDD21 curve using the shielding tape 30 of the present invention, and curve 2 is the SDD21 curve using the traditional shielding tape in FIG. 1. It can be seen that as the frequency increases, the differential insertion loss of the cable 100 using the shielding tape 30 of the present invention is obviously smaller than the differential insertion loss of the cable using the traditional shielding tape.

In the cable of the present invention, the hot melt glue does not cover the entire outer surface of the shielding layer 31, but only covers some areas. After the cable 100 is covered with the shielding tape 30, only the overlapping part has glue, and other parts have no glue, which will not increase the insulation loss factor. Therefore, the overall attenuation value of the cable 100 is smaller and the loss is lower.

The invention claimed is:

1. A cable comprising:

a pair of core wires;

a shielding tape covering the pair of core wires; and an outer insulation layer covering the shielding tape; wherein the shielding tape is longitudinally wrapped around the pair of core wires, the shielding tape includes a shielding layer and a glue layer located on the outer surface of the shielding layer, and the glue layer is only provided on an overlapped portion of the shielding tape; and the glue layer is only provided on one surface of the shielding layer.

2. The cable as claimed in claim 1, wherein the thickness of the glue layer is between 0.001 mm and 0.006 mm.

3. The cable as claimed in claim 2, wherein the thickness of the glue layer is 0.003 mm.

4. The cable as claimed in claim 1, wherein the surface area of the glue layer accounts for 25% to 30% of the surface area of the shielding layer.

5. The cable as claimed in claim 1, wherein the shielding layer includes a metal layer, an insulating layer, and an intermediate adhesive layer that combines the metal layer and the insulating layer.

\* \* \* \* \*